United States Patent
Ho et al.

(10) Patent No.: US 6,699,046 B2
(45) Date of Patent: Mar. 2, 2004

(54) PIN GRID ARRAY INTEGRATED CIRCUIT CONNECTING DEVICE

(75) Inventors: Kwun-Yao Ho, Taipei (TW); Kung Moriss, Taipei (TW); Lin-Chou Tung, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/151,679

(22) Filed: May 20, 2002

(65) Prior Publication Data

US 2003/0096514 A1 May 22, 2003

(30) Foreign Application Priority Data

Nov. 16, 2001 (TW) .......................................... 90219743

(51) Int. Cl.[7] .............................................. H01R 12/00
(52) U.S. Cl. ............................ 439/70; 439/91; 439/260; 174/263; 361/767; 361/772
(58) Field of Search ............................... 439/70–72, 91, 439/260; 174/263; 361/767, 772

(56) References Cited

U.S. PATENT DOCUMENTS 5,481,436 A * 1/1996 Werther ...................... 361/784
6,081,429 A * 6/2000 Barrett ......................... 361/767
6,164,981 A * 12/2000 Lin et al. ...................... 439/70

* cited by examiner

Primary Examiner—Truc Nguyen

(57) ABSTRACT

A pin grid array integrated circuit connecting device which including a substrate, a sliding slice, a guiding frame and a driving apparatus. Said substrate further includes multiple holes to hold pins of a integrated circuit package, multiple conductive positioning components in the holes to hold said pins and connect said pins electrically, circuit device with proper circuit layout and multiple electrical connecting spots on the bottom of said substrate which connecting said multiple conductive positioning components thru said circuit device. The extra electronic components placed on said substrate will provide the additional function. Said sliding slice is placed on the top of said substrate and can be moved relatively. Multiple holes are placed on said sliding slice and positioned correspondingly to the holes on said substrate. Said guiding frame is placed on at least the two opposite sides of said substrate which guide said sliding move linearly along the extension of said guiding frame. Said driving apparatus is connecting to said sliding slice and, by rotating horizontally, drive said sliding slice to move in a proper manner linearly.

18 Claims, 8 Drawing Sheets

PIN GRID ARRAY INTEGRATED CIRCUIT CONNECTING DEVICE

BACKGROUND OF THE INVENTION (a) Field of the Invention

The present invention relates to a pin grid array integrated circuit connecting device. Especially, the present invention relates to a pin grid array integrated circuit connecting device which is placed firmly on a circuit board and is with holes matrix on a circuit layout substrate to provide the connecting function to connect a integrated circuit package electrically.

(b) Description of the Prior Arts

For long time in prior art, there are two basic methods to place integrated circuit package (IC package) on circuit board (or main board). One is to solder the integrated circuit package on the circuit board but the integrated circuit package is not swappable. The other method is that the integrated circuit package is replaceable and swappable; the integrated circuit package can be replaced when necessary. Most of time, swappable integrated circuit package is employed when the circuit board need to be upgraded, the integrated circuit package itself need to be replaced or in some cases that expensive integrated circuit package device is required. The swappable integrated circuit package device is used when one of the devices on circuit board broken or need to be replaced but the rest of components on the board still in good condition, the computer's CPU (Central Processing Unit) is a best example.

Please refer to FIG. 1 and FIG. 2, which showing a conventional swappable integrated circuit device 10 in prior art. In prior art, an integrated circuit device 11 has pins 111 and the circuit board 12 has a socket 13 with multiple pin holes 131 in order to connect each other in better electrical condition. There are two basic methods to seal the integrated circuit device 11, one is called lead frame and the other is ball grid array (BGA). In recent years, another method called flip chip BGA packaging is used often in sealing high-numbered pins integrated circuit package. FIG. 1 shows the basic components which comprising an integrated circuit chip 112 placed on one side of the substrate 113 by flip chip method. Several solders 114 are placed on the other side of the substrate 113, which connecting the integrated circuit chip 112 and the substrate 113.The other side of the integrated circuit chip 112 has a heat sink 115. For the pins 111 are not hard enough, they are easy to be broken when swapping. And for the pins 111 are not easy to connect the solder 114 firmly, before being soldered to the solder 114, they have to be placed on an interposer 116 by modeling technology. Doing so only enlarge the thickness of the integrated circuit device 11, which against the trend of small and thin in modern electronic industry.

In order to provide the function that the pins 111 of the integrated circuit device 11 can be placed on it, the socket 13 in prior art comprises a socket base 132 with a plurality of holes 131 soldered on the circuit board 12, a sliding board 133 placed on the top of the socket base 132 which can slide linearly, and a long pull bar 134 placed aside the socket base 132 to be used to move the sliding board 133 in a micro manner. Every hole 131 in the socket base 132 has metal slice with electric conductivity. In the bottom of the holes 131, there are tiny tin balls for soldering purpose and provide the function of electrical connectivity to the circuit board 12. The corresponding location of sliding board 133 to the holes 131 has a bigger hole, and by pushing down the long pull bar 134 rotating along with the axle 136 till reaching as the same horizontal level as the socket base 132 will move the sliding board in a micro manner and make the pins 111 of the integrated circuit device 11 hold tightly in the holes 131. When removing integrated circuit device 11, the long pull bar 134 will be moved until reach the vertically position with the socket base 132. However, the way of swap the integrated circuit device in prior art has many disadvantages as follows:

(1) In prior art, the socket base of the socket is made of plastic with modeling or plastic injection technology. Its function is limited to holding and positioning the pins on the integrated circuit package, no extra function it provides.

(2) In prior art, the pulling part of the socket takes much space; it needs extra space to hold the pulling part and the axel. During operation, the pulling part needs space, and not any component can be placed in the space.

(3) The cost is relatively higher; the socket is complex, more components should be placed on the socket and it needs more cost.

SUMMARY OF THE INVENTION

The primary aspect of the present invention is to provide a pin grid array integrated circuit connecting device. Especially, a pin grid array integrated circuit connecting device that places plural holes on the substrate to replace the plastic socket base in prior art. More over, extra electronic components and layout can be placed on the substrate to provide extra function as well as the smoothness of contacting surface of the substrate and the circuit board is improved.

In another aspect of the present invention is that the invention provides a pin grid array integrated circuit connecting device which provides a driving apparatus which can rotate horizontally to move a sliding slice in a proper linear manner on the top of the substrate that replaces the pulling part in prior art, which is complex and space taking.

In order to achieve the above purpose, the present invention is that the invention provides a pin grid array integrated circuit connecting device which comprises a substrate, a sliding slice, a guiding frame, a driving apparatus and some extra electronic components. The substrate further comprises multiple holes to hold pins of a integrated circuit package, multiple conductive positioning components in the holes to hold the pins and connect the pins electrically, circuit device with proper circuit layout and multiple electrical connecting spots on the bottom of the substrate which connecting the multiple conductive positioning components thru the circuit device. The extra electronic components placed on the substrate will provide the additional function. The sliding slice is placed on the top of the substrate and can be moved relatively. Multiple holes are placed on the sliding slice and positioned correspondingly to the holes on the substrate. The guiding frame is placed on at least the two opposite sides of the substrate which guide the sliding move linearly along the extension of the guiding frame. The driving apparatus is connecting to the sliding slice and, by rotating horizontally, drive the sliding slice move in a proper manner linearly, which taking less space and no limit in operation.

The appended drawings will provide further illustration of the present invention, together with the description, serve to explain the principles of the invention.

DETAILED DESCRIPTION OF THE PRESENT INVENTION

The present invention relates to a pin grid array integrated circuit connecting device. Especially, the present invention relates to a pin grid array integrated circuit connecting device which is featured with plural pin holes on a substrate to replace the plastic socket base in prior art, and some extra electronic components and circuit layout can be placed on the substrate to provide additional function. More over, a driving apparatus that can rotate horizontally will be placed to move the sliding slice linearly on the top of the substrate, which replace the pulling part used in prior art and save much space.

The following embodiments will illustrate detail information of the operation, the method, the effect of the pin grid array integrated circuit connecting device of the present invention.

In order to explain more detail about the features and the embodiment of the present invention, the follows will introduce a couple of embodiments of the pin grid array integrated circuit connecting device of the present invention.

Figure 3:
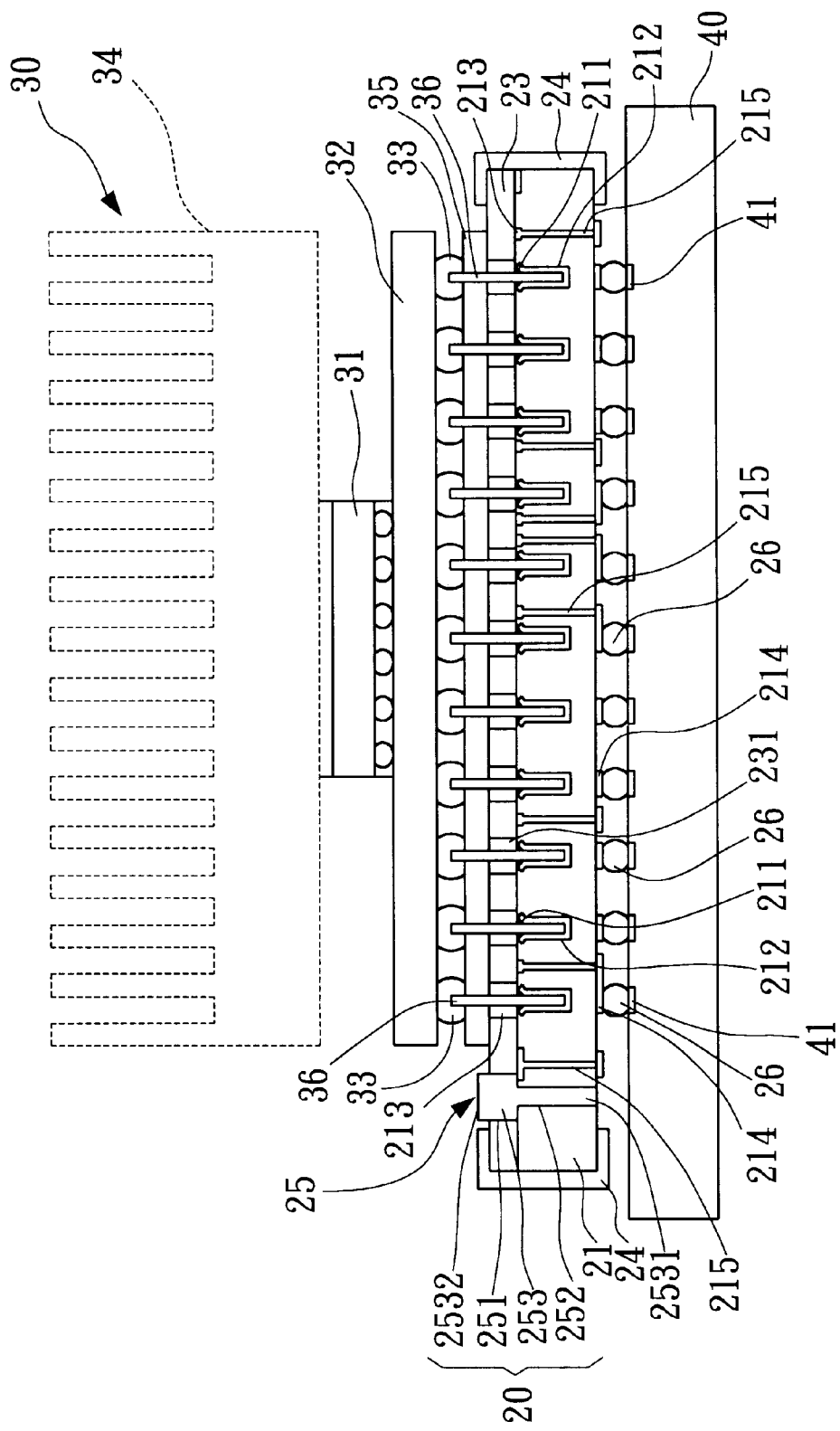
FIG. 3 shows the side view of the first preferred embodiment of the present invention of a pin grid array integrated circuit connecting device.
Figure 4:
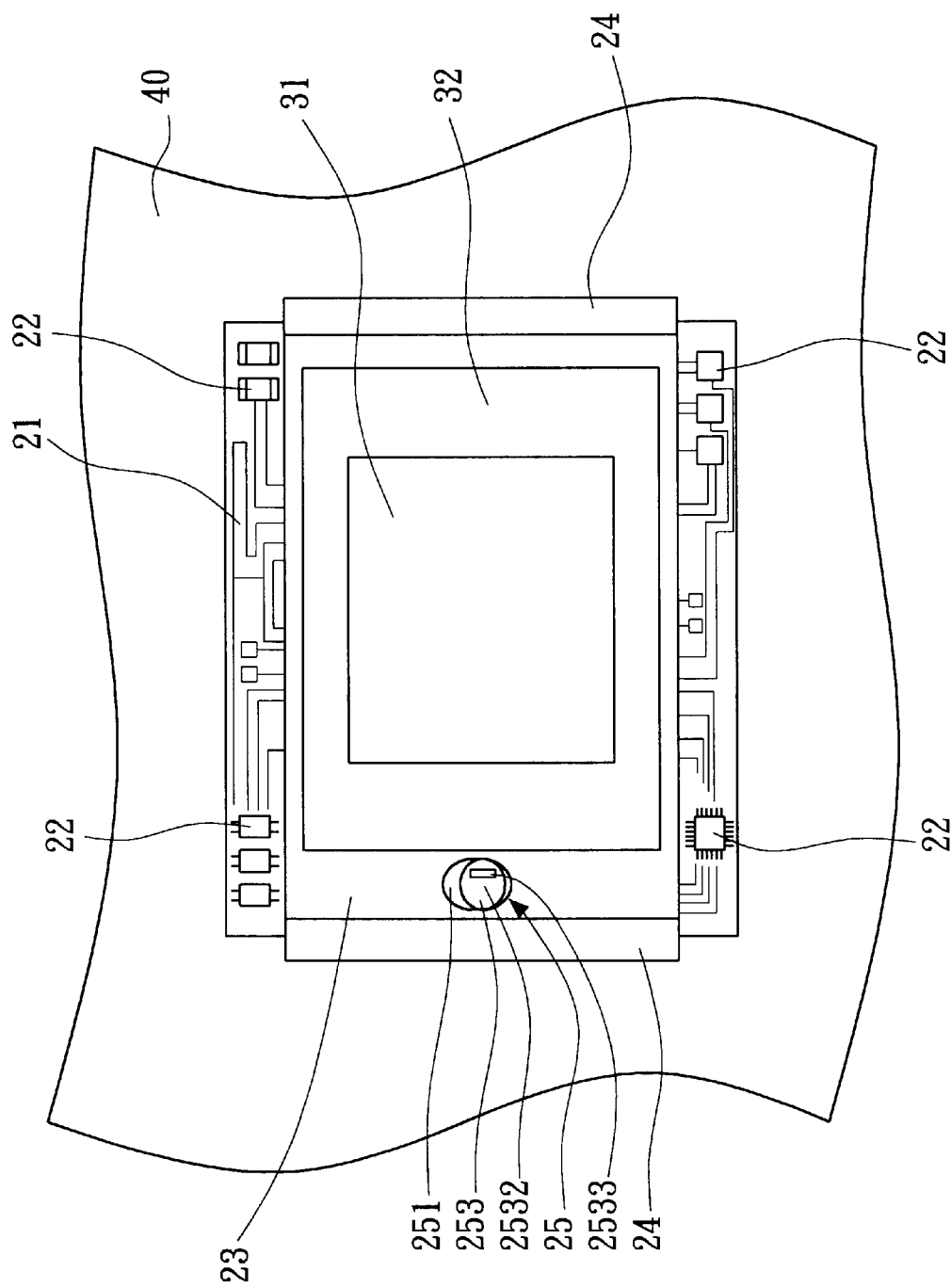
FIG. 4 shows the top view of the embodiment in the FIG. 3.

As shown in FIG. 3 and FIG. 4, which are the side view and the top view of the first embodiment of the pin grid array integrated circuit connecting device 20 of the present invention. As shown, the pin grid array integrated circuit connecting device 20 is used to connect electrically the integrated circuit package 30 and the circuit board 40 (or main board).

The integrated circuit package 30 comprises an integrated circuit chip 31 and a substrate 32 with circuit layout. The substrate 32 has some solder balls 33 on the bottom; the solder balls 33 connect electrically the active side of the integrated circuit chip 31; the other side of the integrated circuit chip 31 has a heat sink 34 to cool the heat. In the embodiment, the integrated circuit chip 31 is a conventional flip chip BGA component, however, it could be other BGA component such as wire bond or tape automated bonding (TAB). In this preferred embodiment, as in prior art, the interposer 35 and the multiple pins 36 are placed on the substrate 32 of the integrated circuit package 30 and the pins 36 are connected electrically to their corresponding conduct balls 33.

On the surface of the circuit board 40, there are some contact pads 41 made of conduct material. It will be better if the material of the contact pads 41 is nickel, gold, chromium, copper, iron, aluminum, titanium, lead, tin or other alloy. The contact pads 41 are exposed and used to connect the pin grid array integrated circuit package 20 by soldering. Some extra electronic components also can be placed on the circuit board to provide other functions, but it is the area this specification will cover.

Please refer to FIG. 3 and FIG. 4, which showing the first preferred embodiment of the pin grid array integrated circuit connecting device 20 of the present invention. As shown, the pin grid array integrated circuit connecting device 20 of the present invention comprises a substrate 21, some electronic components 22, a sliding slice 23, a guiding frame 24 and a driving apparatus 25.

The substrate 21 further comprises some multiple pin holes 211, multiple conduct positioning components 212, circuit device 213 and multiple conduct connecting spots 214. The multiple pin holes 211 are placed on the top of the substrate 21, the locations of the multiple pin holes 211 are matching correspondingly the multiple pins 36. Therefore, the pins 36 of the integrated circuit package 30 can be inserted into the corresponding pin holes 211 to connect the integrated circuit package 30 on the top of the substrate 21. The multiple conduct positioning components 212 are placed in the pin holes 211 to hold the pins 36 and connect the pins 36 electrically. The multiple conduct connecting spots 214 are placed on the bottom of the substrate 21, which will be soldered on the contact pads 41 of the circuit board 40 with solder 26 and connect electrically the circuit layout of the circuit board 40.

Figure 1:
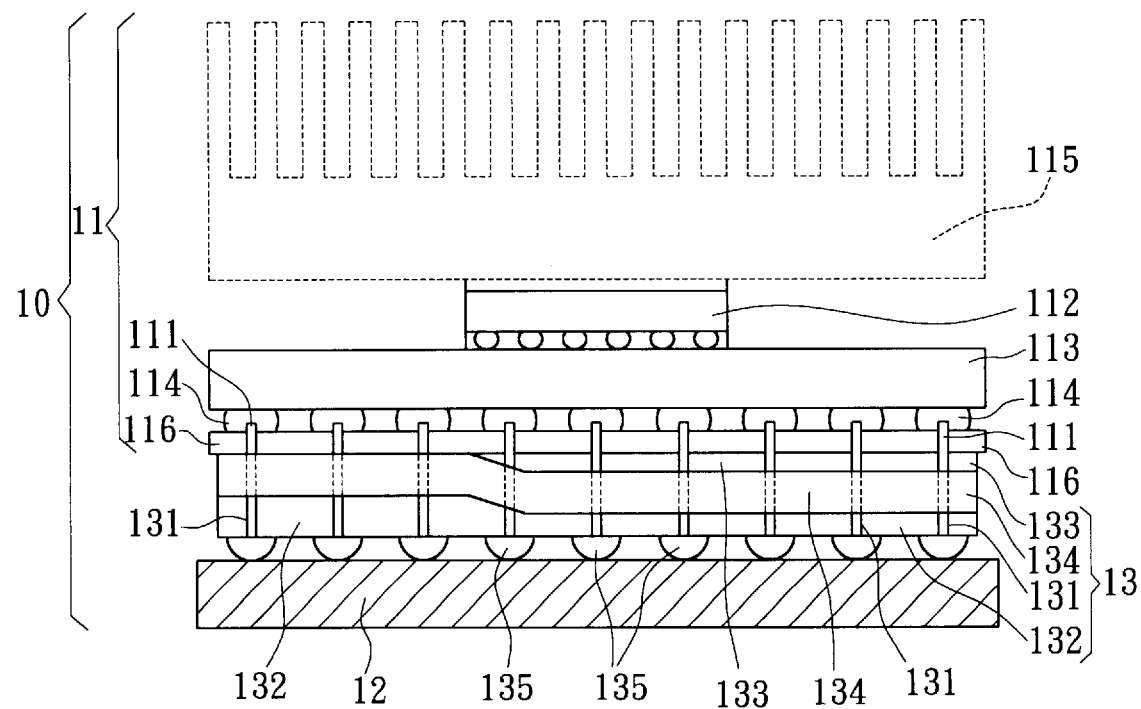
FIG. 1 shows the side view of a conventional pin grid array integrated circuit connecting device in prior art.
Figure 2:
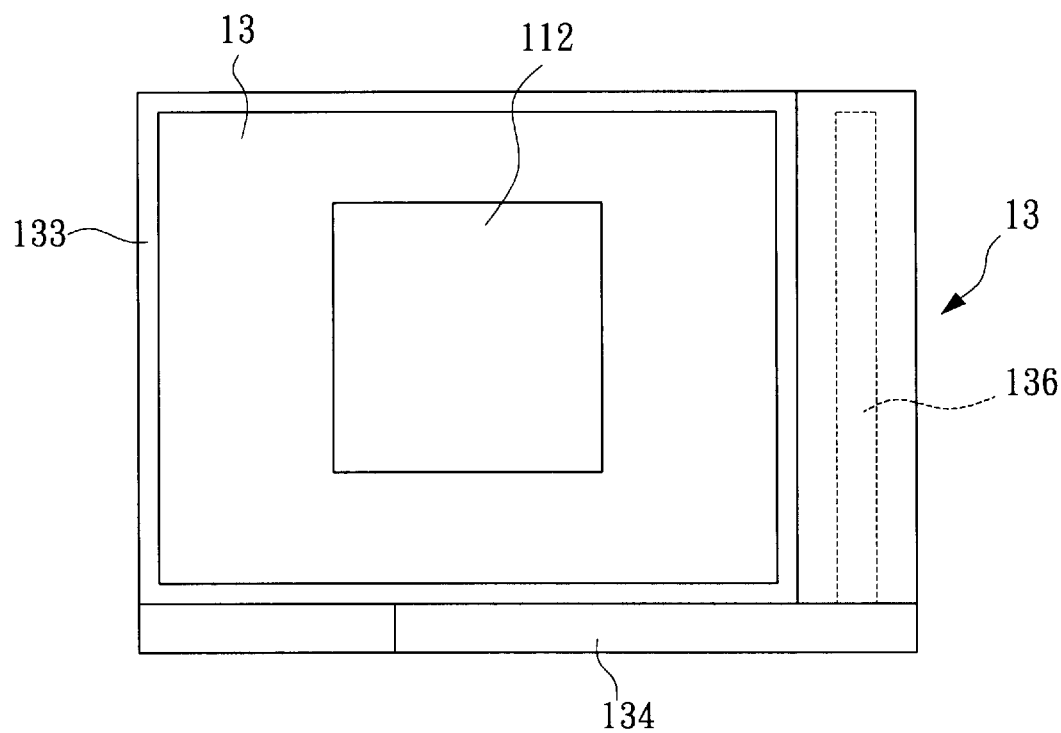
FIG. 2 shows the top view of a conventional pin grid array integrated circuit device in prior art.

In this embodiment, the circuit device 213 of the substrate 21 comprises top layer, middle layer and bottom layer. Each layer is with circuit layout. And some conduct post 215 are set up on the place without the pins 211 to connect electrically the circuit layout of the top layer and the bottom layer. The circuit layout on the top and the bottom of the substrate 21 are connected electrically the conduct positioning components 212 and the conduct connecting spots 214 respectively. For the substrate 21 has the circuit device 213, additional functions can be provided by special design of the circuit device 213, or by some other electronic components 22 placed on the substrate 21, such as the function of adjusting working voltage and working frequency of the integrated circuit package 30, or some extended portion can be made to connect external testing equipments, or some passive components can be placed to change the electrical feature of the integrated circuit package 30, or other functions. Not like the plastic socket of the FIG. 1 and FIG. 2 in prior art only provide the function of connecting.

More, there is a copper land on the substrate 21. With the copper land, the smooth co planarity of the solder ball is much better than the socket base 132 of the circuit socket 13 in prior art.

Figure 9:
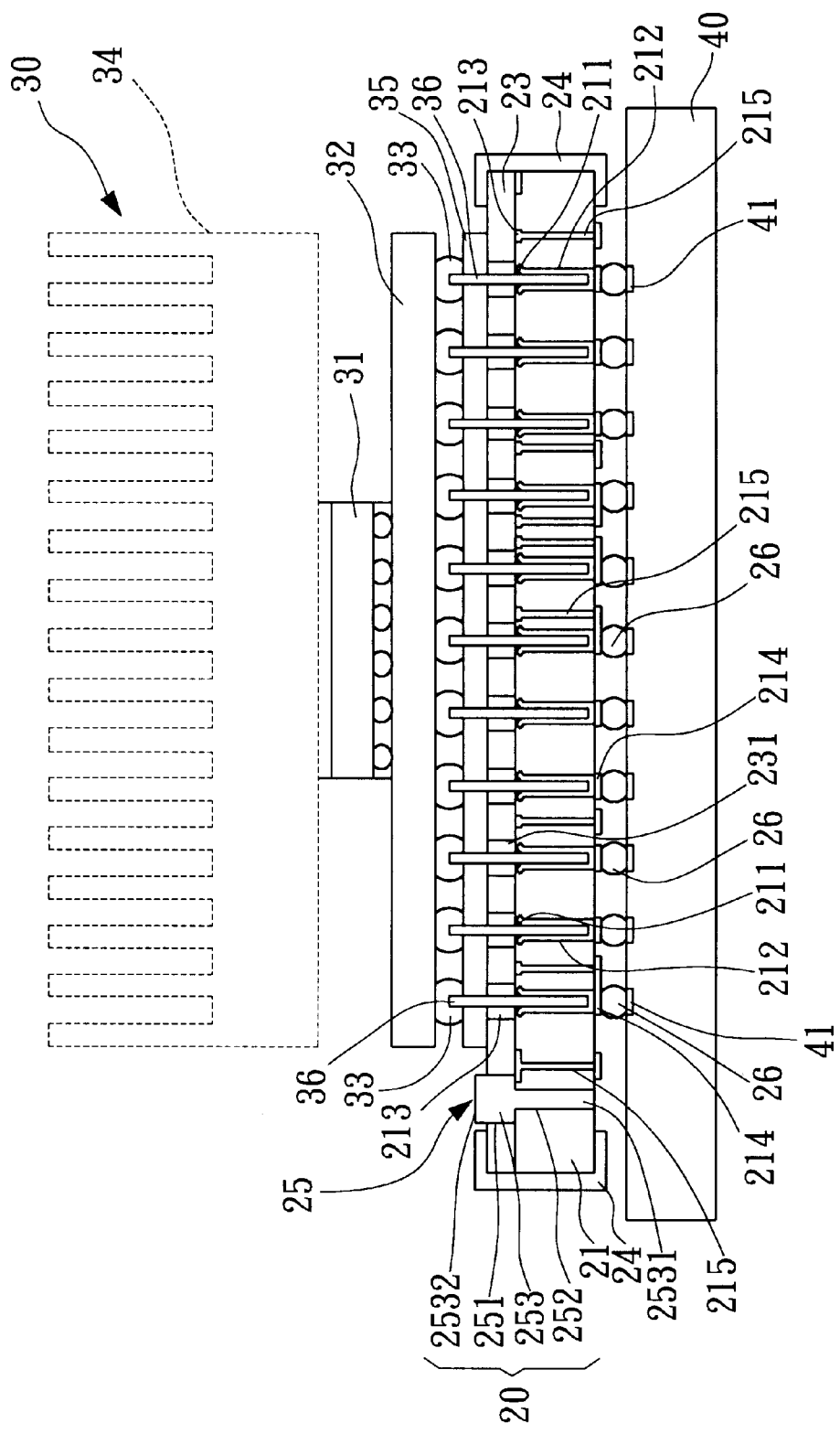
FIG. 9 shows the side view of the sixth preferred embodiment of the present invention of a pin grid array integrated circuit connecting device.

FIG. 9 is showing another embodiment, the pin holes 211 is penetrating through the substrate 21, so, the substrate can be made as a single-layered circuit board or a double-layered circuit board to low down the manufacturing cost.

The sliding slice 23 is placed on the top of the substrate 21 in a relative sliding manner. Each of multiple open holes 231 is placed on the sliding slice 23 and corresponding to each of the holes 211, and the size of the open hole 231 is a little bigger than the holes 211. The guiding frame 24 is placed on at least the two opposite sides of the substrate 21 which guide the sliding move linearly along the extension of the guiding frame 24.

The guiding frame 24 is used to keep the sliding slice 23 on the top of the substrate 21 and limit the sliding slice 23 move along with the extension of the guiding frame in a linear manner.

The driving apparatus 25 is connecting to the sliding slice 23 and, by rotating horizontally, drive the sliding slice 23 move in a proper linear manner. In this embodiment, the sliding slice 23 and the guiding frame are two independent components, and the driving apparatus 25 further comprises a open hole 251, a pivot hole 252 and a rotating part 253.

The open hole 251 is set on a proper place on the sliding slice 23 and is penetrating the sliding slice 23. In this embodiment, the open hole 251 is oval-shaped structure, that is, the length along with the linear moving direction of the open hole 251 is longer than the vertical length of the linear moving of the open hole 251. The pivot hole 252 is placed on a place of the substrate 21 corresponding to the open hole 252. The rotating part 253 comprises a pivot 2531 and a horizontal protruding driving block 2532 placed on the top of the pivot 2531. The driving block 2532 and the pivot 2531 is a non-concentric-circles cam structure; there is a turning part 2533 on the top of the driving block 2532 which can be adjusted by the user with finger or tool. The pivot 2531 is placed in the pivot hole 252 and is in the open hole 251 in the same time with the driving block 2532. Rotating the rotating part 253 to move the driving block 2532 along with the pivot 2531 will move the inner side of the open hole 251 and further move the sliding slice 23 in a linear manner.

For the driving apparatus comprising the open hole 251, the pivot 252 and the rotating part 253, it needs less space on the circuit board 40 than in prior art.

In another embodiment (not shown), of course, the open hole can be placed on the guiding frame, and the rotating part 253 can be designed as a pushing component which moving horizontally and linearly along with the open of the guiding frame 24. The bottom of the pushing component is fixed on the sliding slice 23, so, moving the pushing component will also move the sliding slice 23 in a linear manner.

Figure 5:
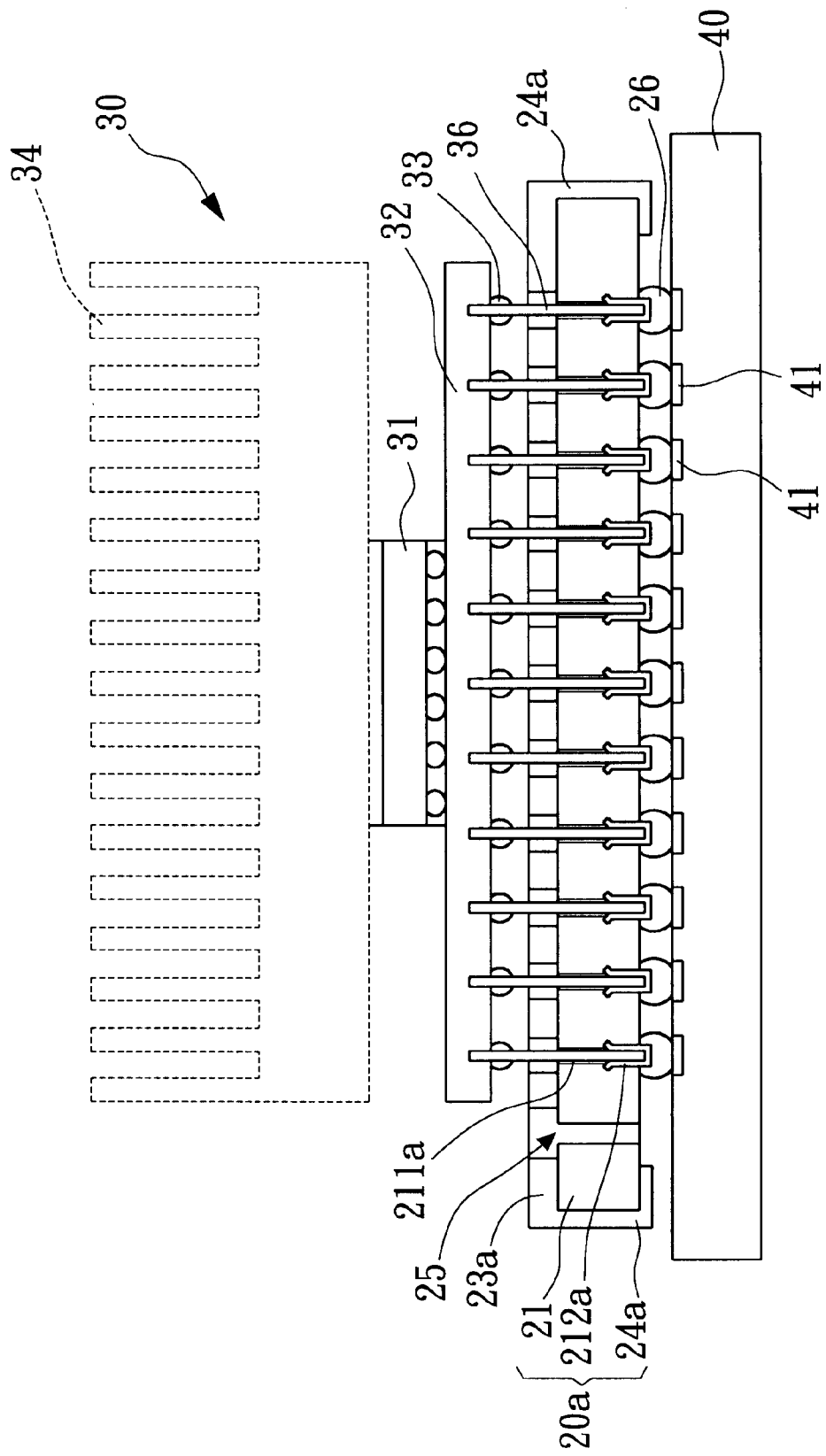
FIG. 5 shows the side view of the second preferred embodiment of the present invention of a pin grid array integrated circuit connecting device.

Please refer to FIG. 5, which is the side view of the second preferred embodiment of the present invention of the pin grid array integrated circuit connecting device 20a. This embodiment is similar to the embodiment shown in FIG. 3. The pin grid array integrated circuit connecting device 20a also comprises a substrate 21, a sliding slice 23a, a guiding frame 24 and a driving apparatus 25. Some extra electronic components such as component 22 can be added depending on if necessary. The substrate 21 also comprises multiple pin holes 211a, multiple conducting positioning components 212a, a circuit device with proper layout and multiple conducting spots.

Most components in the second preferred embodiment shown in FIG. 5 are similar to the components in the FIG. 3 except that the sliding slice 23a and the guiding frame 24a are one complete component; they are independent components in FIG. 3; which further low down the manufacturing cost. More, the pin hole 211a is penetrating thru the substrate to the conducting spots on the bottom. The conducting positioning components 212a is placed near the bottom of the pin hole 211a and protruding a little out from the bottom of the substrate 21 to connect tightly with the solder 26, meanwhile, the top of the conducting positioning 212a is open to hold the pin 36 of the integrated circuit package 30, which make the conducting positioning 212a (or the pins 36) connect electrically and firmly with the corresponding conducting spots. Also, there is no interposer placed on the integrated circuit package 30; the pin 36 is connected with the conducting ball 33 by surface mount technology.

Figure 6:
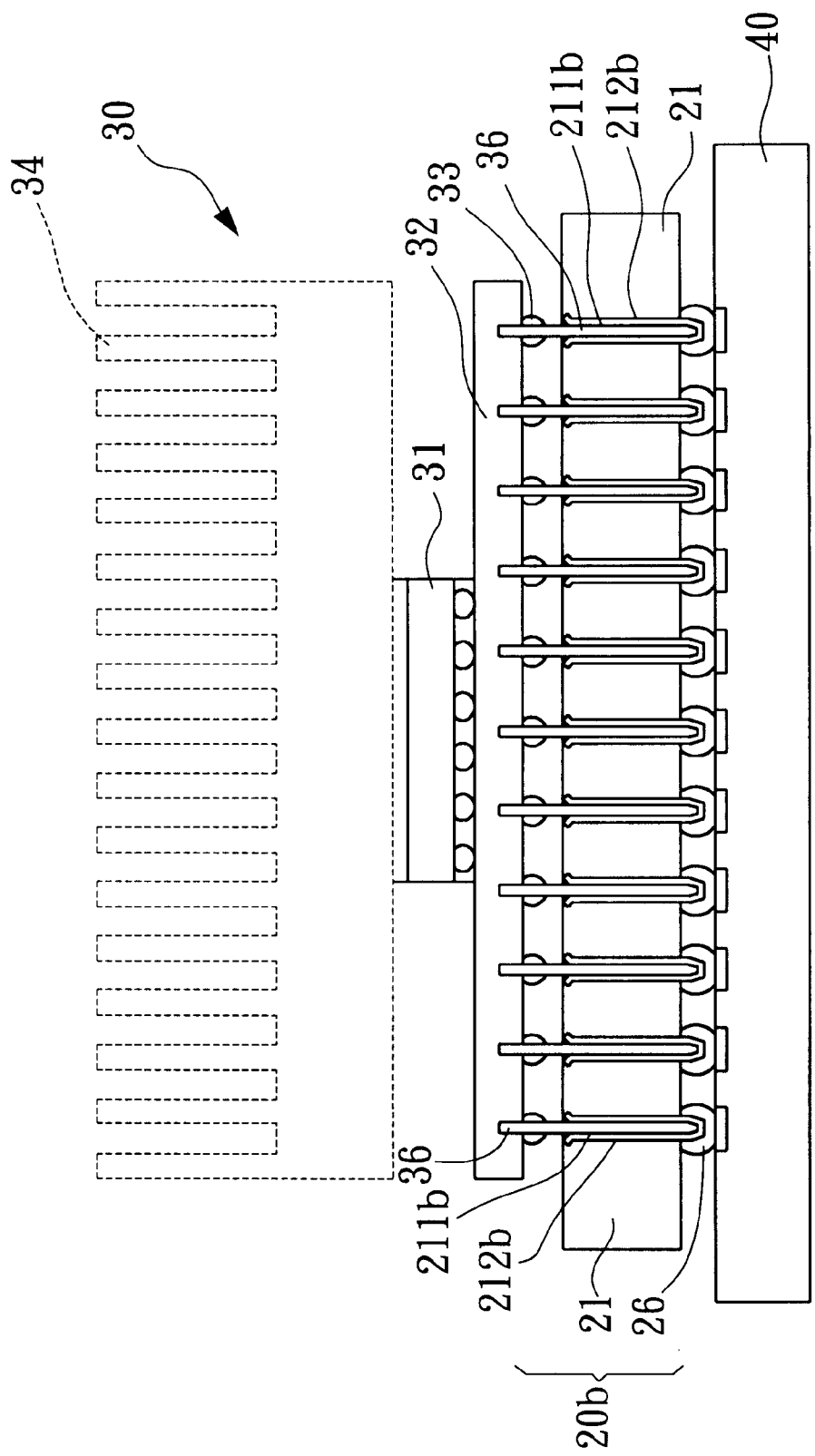
FIG. 6 shows the side view of the third preferred embodiment of the present invention of a pin grid array integrated circuit connecting device.

Please refer to FIG. 6, which is the third preferred embodiment of the present invention of the pin grid array integrated circuit connecting device 20b. In this embodiment, the pin grid array integrated circuit connecting device 20b comprises only a substrate 21 and is connected electrically with the circuit board 40 with the solder 26. The substrate 21 also comprises multiple penetrating pin holes 211b, multiple conducting positioning components 212b, a circuit device with proper layout and multiple conducting spots. The multiple conducting positioning component 212b is penetrating thru the pin holes 211b and its bottom is a little protruding out from the bottom of the substrate 21 and connecting with the conducting spot with the solder 26. As the embodiment shown in FIG. 3, the circuit device in the embodiment shown in FIG. 6 can be designed as special layout to have some extension for testing purpose.

Figure 7:
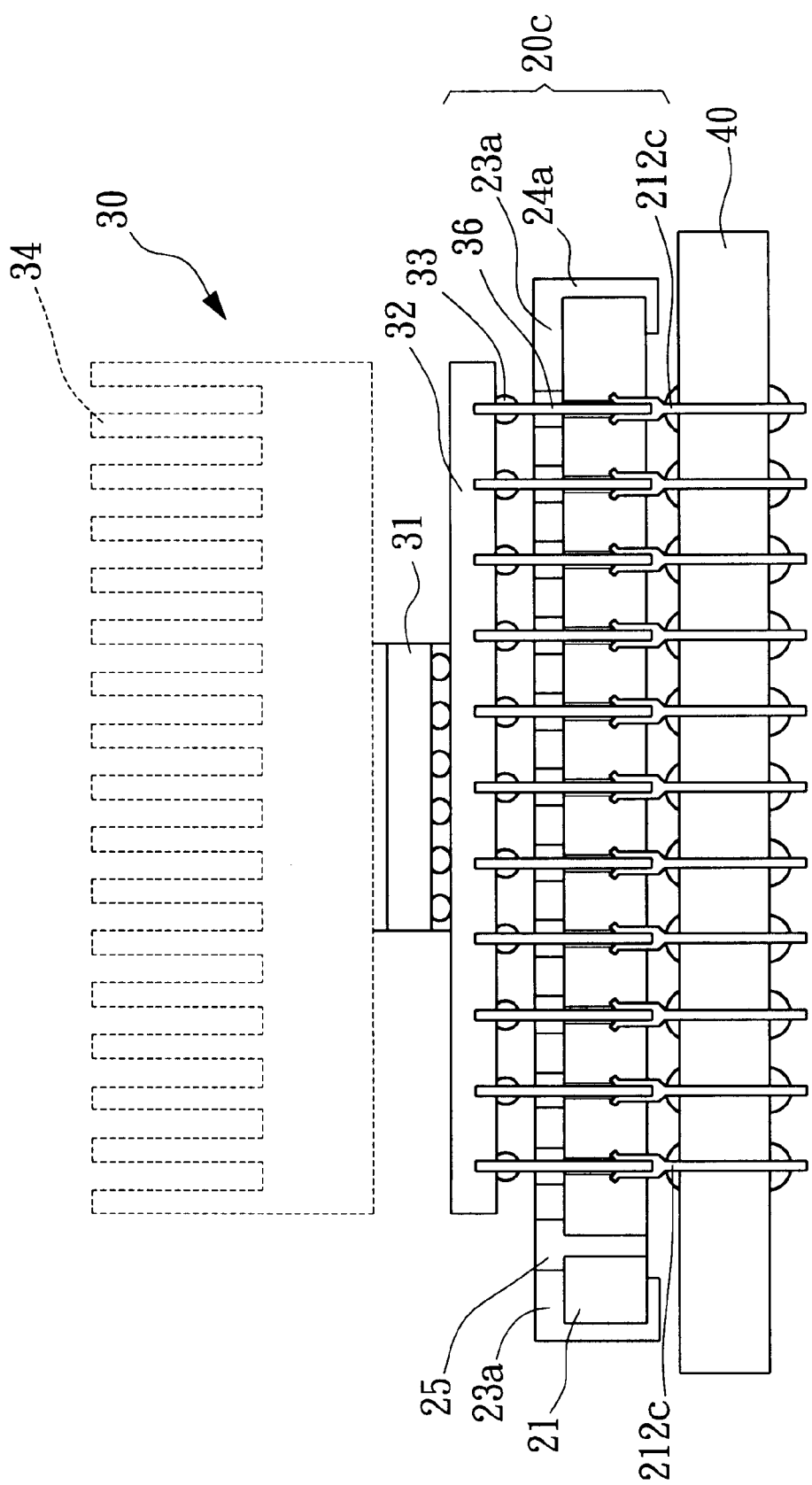
FIG. 7 shows the side view of the forth preferred embodiment of the present invention of a pin grid array integrated circuit connecting device.

Please refer to FIG. 7, which is the forth preferred embodiment of the present invention of the pin grid array integrated circuit connecting device 20c. The components shown in this embodiment are similar to the components in FIG. 5 except that the bottom of the multiple conducting positioning components 212c is extended and penetrating thru the circuit board 40 to provide better connecting effect.

Figure 8:
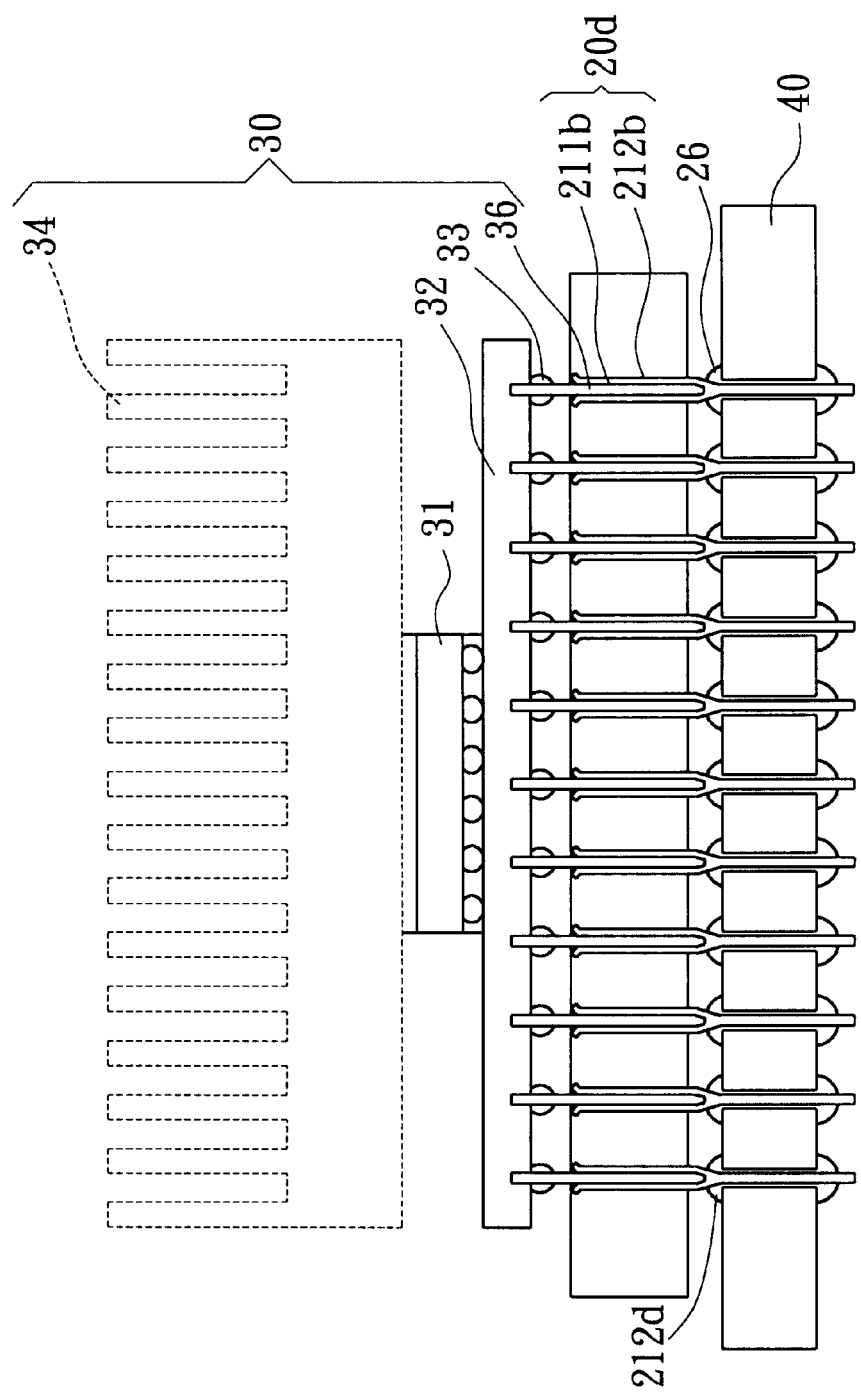
FIG. 8 shows the side view of the fifth preferred embodiment of the present invention of a pin grid array integrated circuit connecting device.

Please refer to FIG. 8, which is the fifth preferred embodiment of the present invention of the pin grid array integrated circuit connecting device 20d. The components shown in this embodiment are similar to the components in FIG. 6 except that the bottom of the multiple conducting positioning components 212d is extended and penetrating thru the circuit board 40 to provide better connecting effect.

Concluding the above descriptions, the present invention at least has the advantages as follows;

(1) Providing extra function; with the proper circuit layout designed in the circuit device on the substrate, additional function can be provided and some extra electronic components can be added.

(2) Taking less space; the present invention adapted the driving apparatus which rotating horizontally to move the sliding slice, which taking less space.

(3) The cost is relatively lower, the sliding slice, the guiding frame and the driving apparatus are used in present invention, their structures are relatively simple, so, the cost is relatively lower.

(4) The bottom of the substrate is more smooth with higher solder ball co planarity; the present invention adapted the copper land used on the bottom of the substrate, which is more smooth and provides better connectivity.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the sprit of the present invention.

What is claimed is:

1. A pin grid array integrated circuit connecting device, which connecting electrically a multiple-pined integrated circuit package with a circuit board having circuit layout and electronic components comprising:

a substrate which comprises:
  a multiple pin holes being placed on top of said substrate, a location of said pin holes being on a place corresponding to said multiple pins;
  multiple conducting positioning components being placed in said pin holes to hold said pins and connect said pins electrically;

a circuit devices being used to connect electrically a bottom of said substrate and said multiple conducting positioning components;

multiple conducting spots being placed on the bottom of said substrate and being used to connect electrically with the circuit layout of said substrate, said multiple conducting spots also connecting electrically with said circuit device properly;

wherein said circuit device is with said substrate with circuit layout on a top and bottom and a conducting post being placed on a place with no pin holes to connect the circuit layout on the top and bottom of said substrate, said circuit layout on said top and bottom of said substrate connecting to the conducting positioning components and the conducting spots respectively.

2. The pin grid array integrated circuit connecting device of claim 1, wherein said pin grid array integrated circuit connecting device further comprises:

a sliding slice being placed on the top of substrate in a relative sliding manner; multiple open holes being placed on said sliding slice corresponding to each of said pin holes, and the size of said open hole being a little bigger than said pin holes;

a guiding frame being placed on at least the two opposite sides of said substrate which guiding and limiting said sliding slice to move linearly along the extension of said guiding frame; and a driving apparatus which connecting to said sliding slice and, with rotating horizontally, driving said sliding slice to move in a proper linear manner.

3. The pin grid array integrated circuit connecting device of claim 1, wherein at least one extra electronic component is placed on said substrate to connect electrically with said circuit device.

4. The pin grid array integrated circuit connecting device of claim 2, wherein said sliding slice and said guiding frame are two independent components.

5. The pin grid array integrated circuit connecting device of claim 2, wherein said driving apparatus further comprising:

a open hole being placed penetratingly on the proper location of said sliding slice, the length along with the linear moving direction of said open hole being longer than the vertical length of said linear moving of said open hole;

a pivot hole being placed on a location of said substrate corresponding to said open hole;

a rotating part comprises a pivot and a horizontal protruding driving block being placed on one end of said pivot, said pivot being placed in said pivot hole and being in said open hole in the same time with said driving block, rotating said rotating part to move said driving block along with said pivot will move the inner side of said open hole and further move said sliding slice in a linear manner.

6. The pin grid array integrated circuit connecting device of claim 3, wherein said extra electronic component is used to adjust working voltage.

7. The pin grid array integrated circuit connecting device of claim 3, wherein said extra electronic component is used to adjust working fraquency.

8. A pin grid array integrated circuit connecting device, which connecting electrically a multiple-pined integrated circuit package with a circuit board having circuit layout and electronic components, it comprises:

a substrate which comprises:

a multiple pin holes being placed on top of said substrate, a location of said pin holes being on a place corresponding to said multiple pins;

multiple conducting positioning components being placed in said pin holes to hold said pins and connect said pins electrically;

multiple conducting spots being placed on the bottom of said substrate and being used to connect electrically with said multiple corresponding conducting positioning components;

a sliding slice being place on the top of the substrate in relative sliding manner;

multiple open holes corresponding to each of said pin holes being placed on said sliding slice and a size of said open hole is a little bigger than said pin holes;

a guiding frame being placed on at least two opposite sides of said substrate which guiding and limiting said sliding slice move linearly along an extension of said guiding frame; and a driving apparatus which connecting to said sliding slice and, with rotating horizontally, drives said sliding slice to move in a proper linear manner; and wherein said substrate further comprises a circuit device to connect the multiple conducting positioning components to said multiple conducting spots the bottom of said substrate; and wherein said circuit device is with said substrate with circuit layout on a top and bottom and a conducting post placed on a place with no pin holes to connect the circuit layout on the top and bottom of said substrate, said circuit layout on said top and bottom of said substrate connecting to the conducting positioning components and the conducting spots respectively.

9. The pin grid array integrated circuit connecting device of claim 8, wherein at least one extra electronic component is placed on said substrate to connect electrically with said circuit device.

10. The pin grid array integrated circuit connecting device of claim 8, wherein said sliding slice and said guiding frame are two independent components.

11. The pin grid array integrated circuit connecting device of claim 8, wherein said driving apparatus further comprising:

a open hole being placed penetratingly on the proper location of said sliding slice, the length along with the linear moving direction of said open hole is longer than the vertical length of said linear moving of said open hole;

a pivot hole corresponding to said open hole being placed on a location of said substrate;

a rotating part comprising a pivot and a horizontal protruding driving block being placed on one end of said pivot, said pivot is placed in said pivot hole and is in said open hole in the same time with said driving block, rotating said rotating part to move said driving block along with said pivot will move the inner side of said open hole and further move said sliding slice in a linear manner.

12. The pin grid array integrated circuit connecting device of claim 9, wherein said extra electronic component is used to adjust working voltage.

13. The pin grid array integrated circuit connecting device of claim 9, wherein said extra electronic component is used to adjust working frequency.

14. A pin grid array integrated circuit connecting device, which connecting electrically a multiple-pined integrated circuit package and a circuit board with circuit layout and electronic components, it comprises:

a substrate which comprises:
- a multiple pin holes being placed on top of said substrate, a location of said pin holes being on a place corresponding to said multiple pins;
- multiple conducting spots being placed on the bottom of said substrate and being used to connect electrically with said multiple corresponding conducting positioning components;
- a circuit devices being used to connect electrically said pin holes and its corresponding conducting spots; and
- at least an extra electronic component being placed on said substrate and connecting electrically with said circuit device;

wherein said circuit device is with said substrate with circuit layout on a top and bottom and a conducting post placed on a place with no pin holes to connect the circuit layout on the top and bottom of said substrate, said circuit layout on said top and bottom of said substrate connecting to the conducting positioning components and the conducting spots respectively.

15. The pin grid array integrated circuit connecting device of claim 14, which further comprising:
- a sliding slice being placed on the top of substrate in a relative sliding manner, multiple open holes corresponding to each of said pin holes being placed on said sliding slice, and the size of said open hole is a little bigger than said pin holes;
- a guiding frame being placed on at least the two opposite sides of said substrate which guiding and limiting said sliding slice move linearly along the extension of said guiding frame; and
- a driving apparatus connecting to said sliding slice and, with rotating horizontally, driving said sliding slice to move in a proper linear manner.

16. The pin grid array integrated circuit connecting device of claim 14, wherein said extra electronic component is used to adjust working voltage.

17. The pin grid array integrated circuit connecting device of claim 14, wherein said extra electronic component is used to adjust working frequency.

18. The pin grid array integrated circuit connecting device of claim 15, wherein said driving apparatus further comprising:
- a open hole being placed penetratingly on the proper location of said sliding slice, the length along with the linear moving direction of said open hole is longer than the vertical length of said linear moving of said open hole;
- a pivot hole being placed on a location of said substrate corresponding to said open hole;
- a rotating part comprising a pivot and a horizontal protruding driving block being placed on one end of said pivot, said pivot is placed in said pivot hole and is in said open hole in the same time with said driving block, rotating said rotating part to move said driving block along with said pivot will move the inner side of said open hole and further move said sliding slice in a linear manner.

* * * * *